(12) United States Patent
Hembree et al.

(10) Patent No.: US 6,224,713 B1
(45) Date of Patent: *May 1, 2001

(54) METHOD AND APPARATUS FOR ULTRASONIC WET ETCHING OF SILICON

(75) Inventors: David R. Hembree; Salman Akram, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,777

(22) Filed: Sep. 14, 1999

Related U.S. Application Data

(62) Division of application No. 09/141,144, filed on Aug. 27, 1998, now Pat. No. 6,124,214.

(51) Int. Cl.[7] .................................................. H01L 21/00
(52) U.S. Cl. .............................. 156/345; 216/90; 216/91; 438/747; 438/753
(58) Field of Search .................................... 438/745, 747, 438/753; 216/90, 99; 156/345 L, 345 LC, 345 LP

(56) References Cited

U.S. PATENT DOCUMENTS

| | | | |
|---|---|---|---|
| 4,501,636 | * | 2/1985 | Valley .................................. 156/345 |
| 4,554,046 | | 11/1985 | Taguchi et al. . |
| 4,602,184 | | 7/1986 | Meitzier . |
| 4,686,406 | | 8/1987 | Meitzler . |
| 4,957,583 | * | 9/1990 | Buck et al. ........................... 156/345 |
| 5,021,120 | | 6/1991 | Buck et al. . |

OTHER PUBLICATIONS

Theo Baum et al. AFM Study of Surface Finish Improvement by Ultrasound in the Anisotropic Etching of Si (100) in Koh for Micromachining Applications, Micromech, Microeng. 1997, pp. 338–342.

* cited by examiner

Primary Examiner—William Powell
(74) Attorney, Agent, or Firm—Dickstein Shapiro Morin & Oshinsky LLP

(57) ABSTRACT

Methods of forming substantially defect-free silicon structures at the submicron level by enhancing microscopic etchant concentration uniformity and reducing hydrogen bubble adhesion. Etchant mixtures are subjected to the application of ultrasonic waves. The ultrasonic waves promote cavitation that mixes the etchant mixture on a microscopic level, and also assists in promoting bubble detachment. Wetting agents are added to the etchant mixture to enhance the hydrophilicity of the silicon surfaces and thereby reduce bubble adhesion. Apparatus to carry out the method of forming silicon structures are also disclosed.

10 Claims, 5 Drawing Sheets

METHOD AND APPARATUS FOR ULTRASONIC WET ETCHING OF SILICON

This application is a divisional of Ser. No. 09/141,144, filed Aug. 27, 1998, now U.S. Pat. No. 6,124,214.

FIELD OF THE INVENTION

The present invention relates to the field of wet chemical etching and, in particular, to wet chemical etching of micromachined devices, such as silicon semiconductor structures. The process is particularly adapted for use in producing improved pattern definition in the etching of intricate silicon microstructures.

BACKGROUND OF THE INVENTION

As the demand for ever-smaller silicon devices continues, and as resolution continues below the sub-micron level, the need for uniform and precise micromachining is increasing. Microdevices and microstructures used in semiconductor devices and scanning probe microscopy demand smooth surfaces and precise etching at the sub-micron level. In addition, defect-free surfaces are required to bond micromachined parts together during the formation of microdevices.

Micromachining is especially important in the fabrication of contact structures for testing jigs. Because of a trend towards multi-chip modules, semiconductor manufacturers are required to supply bare, unpackaged dice that have been tested and certified as Known Good Die (KGD). Known good die is a collective term that denotes bare, unpackaged die having the same reliability as the equivalent packaged die. The need for known good die has led to the development of test apparatus in the form of temporary jigs or carriers suitable for testing discrete, unpackaged semiconductor dice. The test apparatus must make a non-permanent electrical connection between contact locations on the die, such as bond pads, and external test circuitry associated with the test apparatus. The bond pads provide a connection point for testing the integrated circuitry formed on the die.

Typically the contact structures on the test apparatus take one of two forms: (1) a recessed contact structure or "pit" such as the structures disclosed in U.S. Pat. No. 5,592,736 to Akram et al., which is assigned to Micron Technology, Inc.; or (2) a raised contact structure or "pillar" such as the structures disclosed in U.S. Pat. No. 5,686,317 to Akram et al., which is assigned to Micron Technology, Inc. The contact pit structure is especially usefull for making contact with die such as, e.g.,. bumped die, flip-chips, chip scale packages or ball grid arrays, which have bumps or balls of solderable material such as a lead-tin alloy located on the bond pad of the semiconductor die. Both the pillar and pit structures require precise micromachining so that they make a good electrical connection with the semiconductor die being tested.

Uneven etching produces irregularly shaped contact pits, which require that the die be forced down onto the test apparatus so that the balls or bumps of the device make contact with the test apparatus. The force required to make such contacts often is so great that it damages the die and renders it inoperable.

In addition, uneven surfaces on a device may cause layers deposited thereon to be rough or irregular, thereby impairing electrical functioning and resulting in low processing yields. For example, a layer such as an insulating or conductive layer that is formed on a rough surface may have pinholes or breaks that result in electrical shorts or that otherwise lead to improper electrical functioning of the device.

Micromachining processes using wet chemical etching have the advantages of keeping production costs low, permitting high control of material purity, and being relatively reproducible. However, there are two major disadvantages of wet etching processes: (1) non-uniform concentration of etchant; and (2) hydrogen bubble adhesion.

Uniform wet chemical etching is difficult to achieve because the etchant solution is often non-uniformly concentrated at the microscopic levels of interest. Localized regions of low etchant concentration may occur due to low mobility of the active elements of the solution, causing "dead spots." These dead spots may also be the result of the etchant solution becoming saturated within localized regions. When this happens, the etching action is diminished in spots and results in non-uniform etching.

A known method of increasing local concentrations is to increase the overall concentration of the etchant solution, but this does not resolve the problem of non-uniform concentration. In addition, the resultant solution may become so highly concentrated as to increase the etching rate to an undesirable level in some areas, causing undercutting of the photoresists and loss of control over line resolution and spacing. Other methods to solve non-uniformity, such as the addition of magnetic stir-bars to mix the solution, may improve macroscopic concentration uniformity of the solution, but do not significantly affect non-uniformity on the microscopic level.

A second problem causing non-uniform etching and poor pattern definition is the adhesion of hydrogen bubbles to silicon surfaces during the etching process, which causes rough surfaces on the final product. Bubbles cling to the silicon surface due to the poor wettability of the hydrophobic silicon surface. Because the area of contact between a bubble and the surface is shielded from the liquid etchant, it remains unetched, or etches at a slower rate during the etching process. These inadequately etched areas may appear as pyramid-like islands of silicon on a planar surface or irregular pattern edges on the final product.

There is needed, therefore, a process for improving pattern definition and etch uniformity in the etching of intricate silicon microstructures by increasing etchant concentration uniformity and by decreasing the adhesion of hydrogen bubbles.

SUMMARY OF THE INVENTION

The present invention provides a method for improving etch uniformity and pattern definition when etching silicon microstructures by subjecting a wet etching solution containing wetting agents to ultrasonic waves. The wetting agents minimize bubble adhesion, while the ultrasonic waves serve to mix the solution on a microscopic level, to enhance uniformity of concentration, and also to dislodge bubbles from the surface to be etched. Also provided is an apparatus for carrying out ultrasonic-assisted wet etching.

Advantages and features of the present invention will be apparent from the following detailed description and drawings which illustrate preferred embodiments of the invention.

DETAILED DESCRIPTION OF PREFERRED EMBODIMENTS

Figure 1:
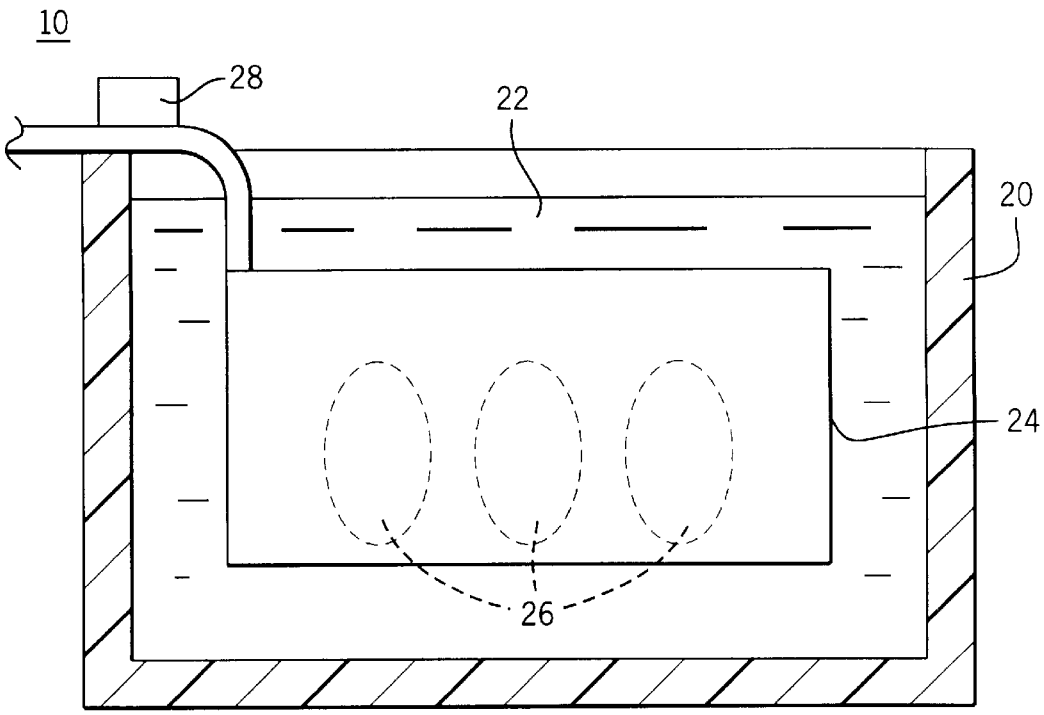
FIG. 1 is a cross-sectional view of the ultrasonic etching apparatus of a preferred embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface which is to be etched in accordance with the process of this invention. The term microstructure as used in this application refers to any silicon structure having a geometry around the sub-micron level, such as a silicon blade, tip, or elevated or depressed structure.

In addition, the invention is not limited to the etching of semiconductor structures, but may be used for any silicon microdevice and may be readily adapted to non-etching applications such as ultrasonic-assisted cleaning given the teachings herein. The following detailed description is, therefore, not to be taken in a limiting sense, and the scope of the present invention is defined by the appended claims.

Wet chemical etching is typically performed by immersion of wafers or other structures into a tank of etchant for a specific time. After the wafers have been etched to a desired degree, they are transferred to a rinse station for etchant removal, and then typically rinsed again before being spin-dried. The method of the present invention includes the immersion of wafers into an improved etchant solution with the simultaneous application of ultrasonic waves.

Ultrasonic waves assist in mixing solutions to improve uniformity of concentration, and in the detachment of bubbles from the silicon surface by generating turbulent liquid flow. Microscopic cavities normally exist in liquids, and the application of ultrasonic waves enhances these cavities by providing energy. After a period of time the cavities grow to a size where the incident wave motion force causes the cavity walls to resonate, eventually causing instability and collapse of the cavities and generating transient, localized turbulent flow. This turbulent flow mixes the solution at a microscopic level to enhance concentration uniformity, and also serves as a force to detach bubbles from the silicon surface.

Bubble formation and growth is related to surface wettability. Wettability may be described by the equation shown below, where S is the wettability coefficient:

$$S = W_{adhesion} - W_{cohesion}$$

Positive values of S represent a wettable surface because the work of adhesion (solid-liquid attraction) is larger than the work of cohesion (liquid-liquid attraction). Wettable surfaces exhibit a very small contact angle between the liquid and the solid because the liquid tends to spread out on the surface of the solid, and to dislodge gas bubbles. Negative values of S represent poorly wettable surfaces because the work of cohesion is larger than the work of adhesion.

Non-wettable or poorly wettable surfaces exhibit large contact angles between the liquid and the solid, and this permits gas bubbles on the solid surface to occupy a greater portion of the surface. Silicon is normally poorly wettable because its hydrogen-terminated surface is hydrophobic. Using wetting agents in the etchant solution increases the hydrophilicity of silicon, improves wettability, and reduces the forces causing bubbles to adhere to the silicon surface. Use of an alkaline etchant solution further facilitates these favorable changes.

The combination of ultrasonic waves with an etchant solution containing a wetting agent facilitates uniform etching because of increased solution concentration uniformity and decreased bubble adhesion. The etchant may be either alkaline or acidic, but alkaline etchants are preferred because they tend to make the silicon surface more wettable, due to replacement of the hydrophobic hydrogen surface termination with hydrophilic hydroxyl surface termination.

The etchant is preferably a strong base such as potassium hydroxide or tetramethyl ammonium hydroxide (TMAH), and is used in an aqueous solution at a concentration of about 40 to 60 percent by weight. A preferred potassium hydroxide etchant solution is used at a temperature of about 40 to 80 degrees Celsius.

Although an alkaline etchant is preferred, acidic etchants in combination with wetting agents may also be used. Suitable acidic etchants include hydrofluoric acid (HF), nitric acid ($HNO_3$), acetic acid ($CH_3COOH$) and phosphoric acid ($H_3PO_4$). Hydrofluoric acid may be used at room temperature in an aqueous solution at a concentration of about 40 to 60 percent by weight, and may be buffered with ammonium fluoride ($NH_4F$) to reduce unwanted ion generation. Phosphoric acid is typically used in an aqueous solution at an elevated temperature of 150 to 180 degrees Celsius. Hydrofluoric and nitric acids are preferred for use in etching pure silicon or silicon dioxide, while phosphoric acid is preferred for etching silicon nitride ($Si_3N_4$).

Wetting agents suitable for use in the process of the invention include surfactants and detergents that will provide the desired wetting effect while not interfering with the action of the etchant. Preferable wetting agents include surfactants such as alcohols, ethoxylates, alkoxylates, sulfates, sulfonates, sulfosuccinates or phosphate esters, and include commercial surfactant mixtures such as the TRITON surfactants manufactured for industrial use by Union Carbide Company. Most preferably an alcohol such as isopropanol, 1-propanol, methanol or ethanol is used. The concentration of wetting agent varies depending on the agent, but for isopropanol can be approximately 15 percent by weight in an aqueous solution.

Ultrasonic waves produced by a transducer are sent through the etchant solution during the etching process. As described above, the application of sonic energy mixes the etchant solution at a microscopic level and also serves to dislodge bubbles that may be adhering to the silicon surface. Preferred conditions include ultrasonic frequencies of 25 to 40 kHz with sinusoidal or square digital waveforms.

Referring now to the drawings, where like elements are designated by like reference numerals, an embodiment of the ultrasonic etching apparatus 10 of the present invention is shown in FIG. 1. The apparatus 10 is comprised of a wet etch tank 20 containing an etchant solution 22. A wafer boat 24 containing silicon wafers 26 or other structures to be etched is lowered into the etch tank 20 so that the silicon wafers 26 are submerged in the etchant solution 22. The etch tank 20 and the wafer boat 24 should be manufactured from materials that do not react or degrade in the presence of common etchants that may be found in the etchant solution 22. These materials include, for example, polypropylene, low density polyethylene, and commercially available plastics such as TEFLON, RYTON, and KYNAR.

An ultrasonic transducer 28 is positioned in such a manner that it imparts sonic energy to the etchant solution 22. The transducer may be active, that is, it may have its own power source and be capable of introducing a power gain, or it may be passive and be connected to an outside power source (not shown).

Referring to FIG. 1, an apparatus 10 comprises a transducer 28 affixed to the wafer boat 24 for the purpose of imparting sonic energy to the etchant solution 22. The wafer boat 24 may be constructed of any material that is capable of withstanding the etchant solution and can also transmit ultrasonic waves, but is preferably made of polypropylene in a thickness of about 0.1 to 0.5 inches.

Figure 2:
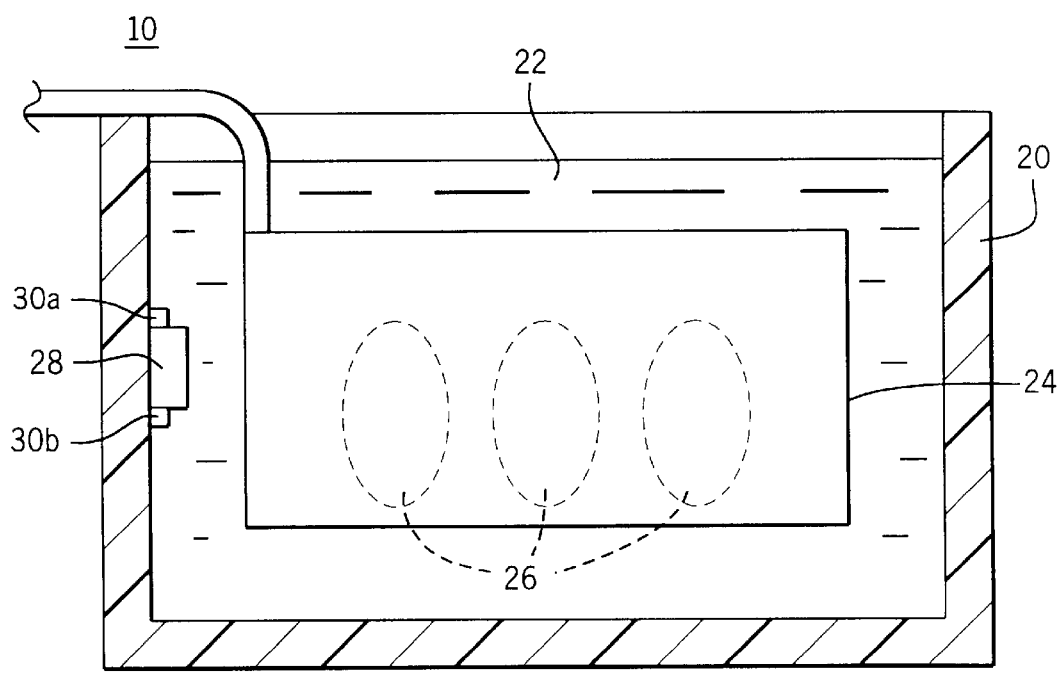
FIG. 2 is a cross-sectional view of the ultrasonic etching apparatus of a second embodiment of the present invention.

As shown in FIG. 2, the transducer 28 may also be affixed to the interior of the etch tank 20 by fastening means 30 such as the indicated brackets 30a, 30b. The transducer 28 may be located on the sides or bottom of the tank 20, as long as it does not interfere with the movement of the wafer boat 24 or with the functioning of other structures such as rinse nozzles (not shown).

Figure 3:
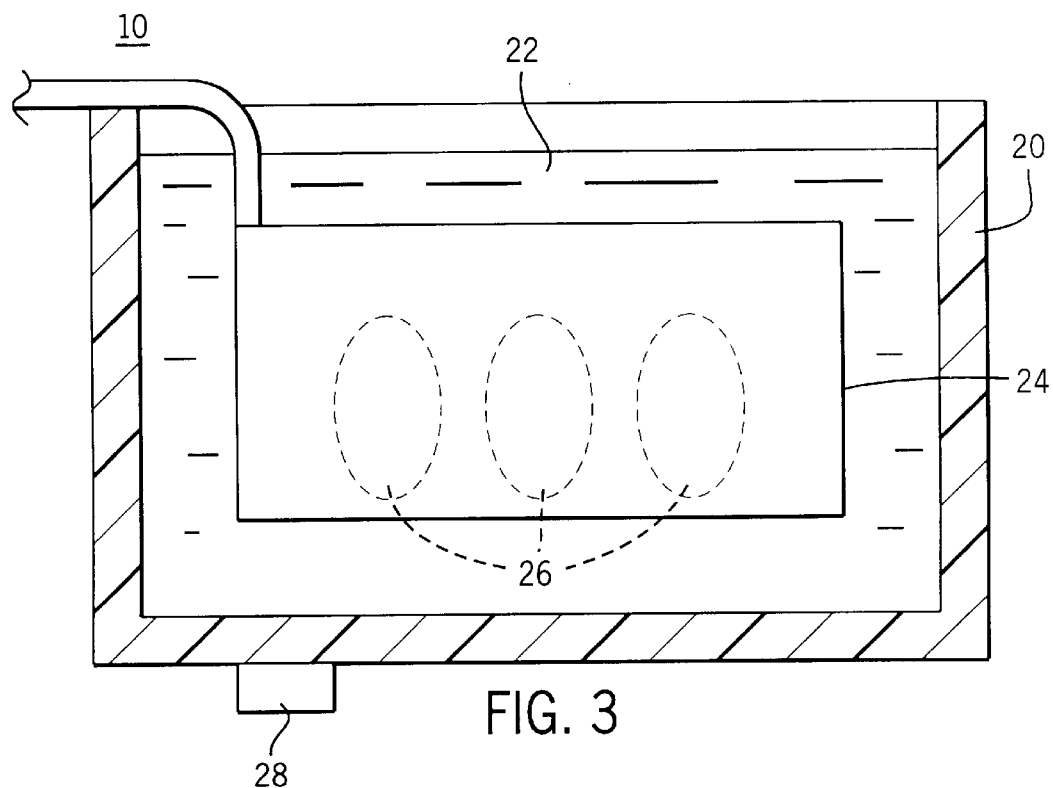
FIG. 3 is a cross-sectional view of the ultrasonic etching apparatus of a third embodiment of the present invention.
Figure 4:
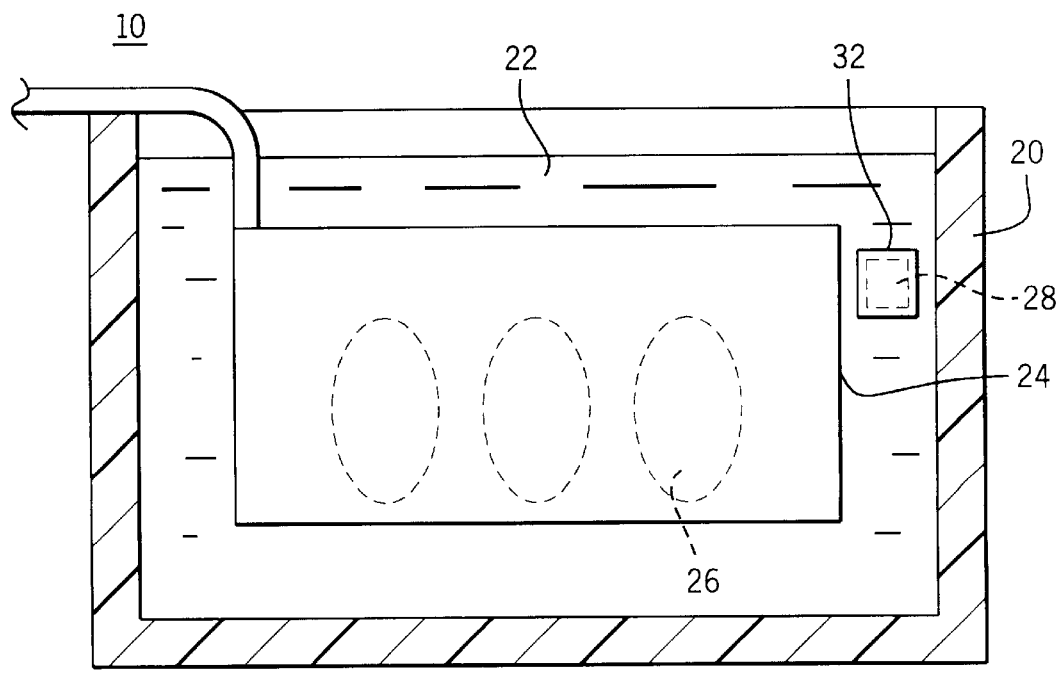
FIG. 4 is a cross-sectional view of the ultrasonic etching apparatus of a fourth embodiment of the present invention.

FIG. 3 illustrates an apparatus 10 with the transducer 28 mounted to the outside of the etch tank 20. An outer tank (not shown) may be used to contain the entire apparatus 10 in order to prevent leakage if the etch tank 20 cracks or splits. Referring now to FIG. 4, a submersible transducer 28 is shown. The transducer 28 is directly submerged into the etchant solution 22, and has a protective sleeve 32 of polypropylene or TEFLON such as polytrafluoroethylene, fluorinated ethylene propylene, ethylene-tetrafluoroethylene and perfluoroalkoxy, to protect the transducer from the etchant solution 22.

Figure 5:
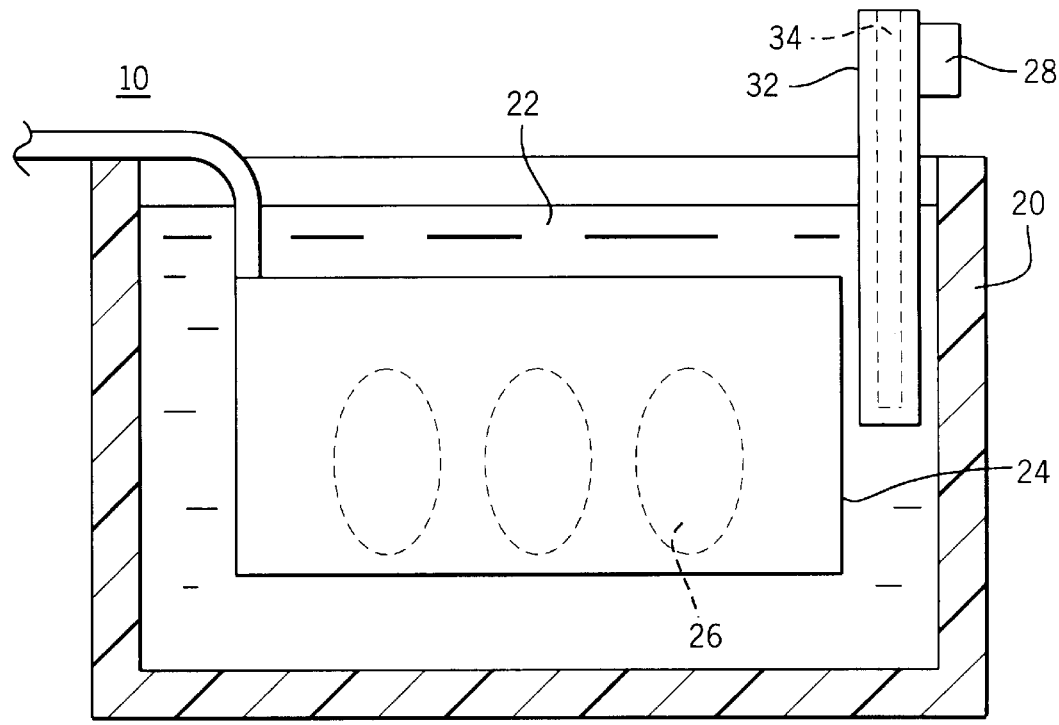
FIG. 5 is a cross-sectional view of the ultrasonic etching apparatus of a fifth embodiment of the present invention.
Figure 6A:
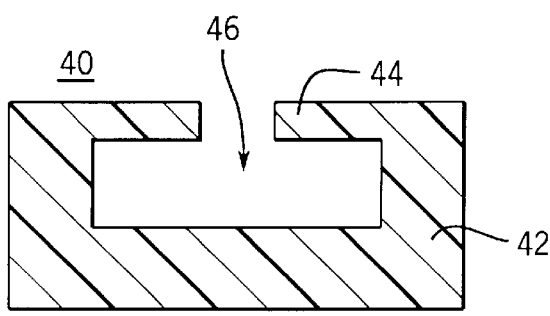
FIG. 6 illustrates silicon microstructures formed by the process of the present invention.
Figure 6B:
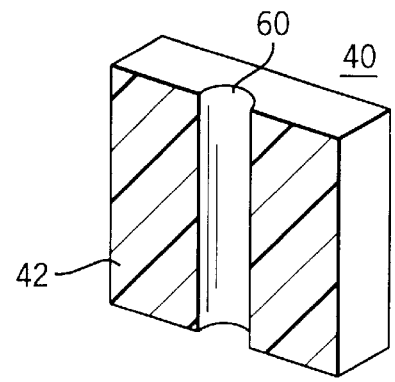
Figure 6C:
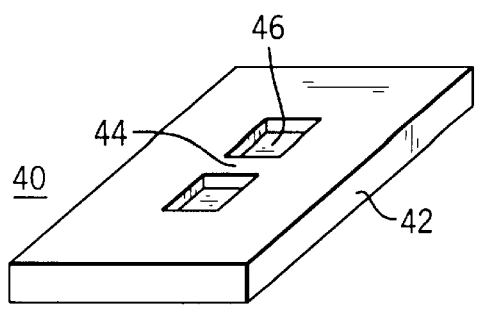
Figure 6D:
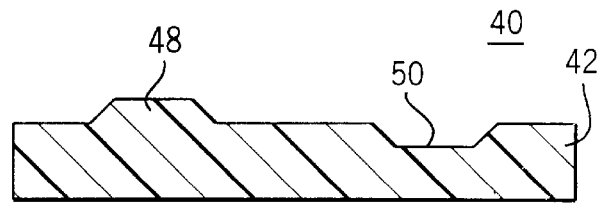
Figure 6E:
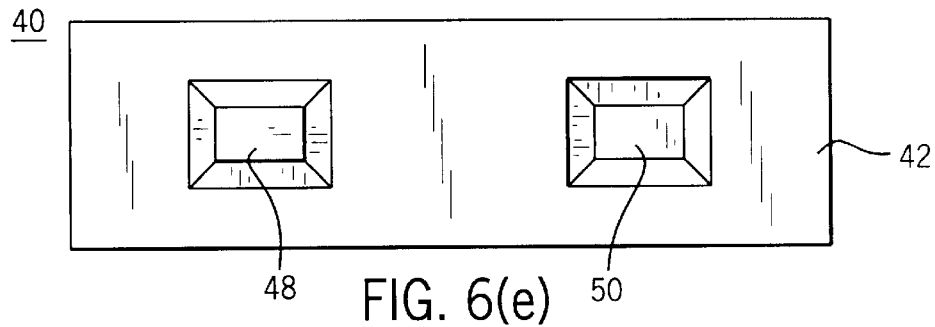

As shown in FIG. 5, the transducer 28 may be mounted on a submersible rod 34 that transmits ultrasonic energy from the transducer 28 to the etchant solution 22 without the need to bring the transducer 28 in direct contact with the etchant solution 22. The rod 34 may be manufactured in a variety of shapes and sizes, including a cylinder having a circular, rectangular, or triangular cross-section, an elongated plate or sheet, or other suitable shape. A preferred material for the rod 34 is stainless steel, most preferably 316 grade stainless steel, due to its efficient transmittal of ultrasonic energy. To protect the rod 34 from the etchant solution 22, a protective sleeve 32 of polypropylene, TEFLON such as polytrafluoroethylene, fluorinated ethylene propylene, ethylene-tetrafluoroethylene and perfluoroalkoxy, or other suitable etchant-resistant material may be used.

FIG. 6 illustrates silicon microstructures 40 that may be created via the process of the present invention. The microstructures 40 may be produced with submicron geometries due to the enhanced precision and substantially defect-free results afforded by the ultrasonic wet etch process of the present invention. The smoother silicon surfaces created by the ultrasonic etching processes of the present invention result in improved deposition of layers thereon, thereby reducing defects and improving processing yields.

FIG. 6(*a*) depicts a silicon substrate 42 that has been etched to produce silicon blades 44 overhanging a pit or depression 46 in the surface of the substrate 42. FIG. 6(*b*) illustrates a wafer or substrate 42 that has been etched to provide a hole 60 passing through the wafer. FIG. 6(*c*) shows a silicon bridge 44 under which has been etched out a depression 46 in the substrate 42. In FIG. 6(*d*) are shown an elevated silicon structure 48 and a depression 50 in the substrate 42 that may be created via the present inventive process. FIG. 6(*e*) illustrates a top view of the structures shown in FIG. 6(*d*).

Figure 7A:
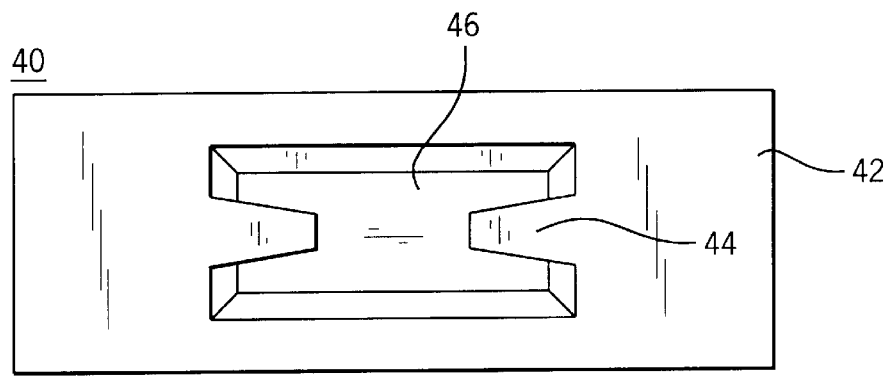
FIG. 7 depicts a contact test pit formed by the process of the present invention.
Figure 7B:
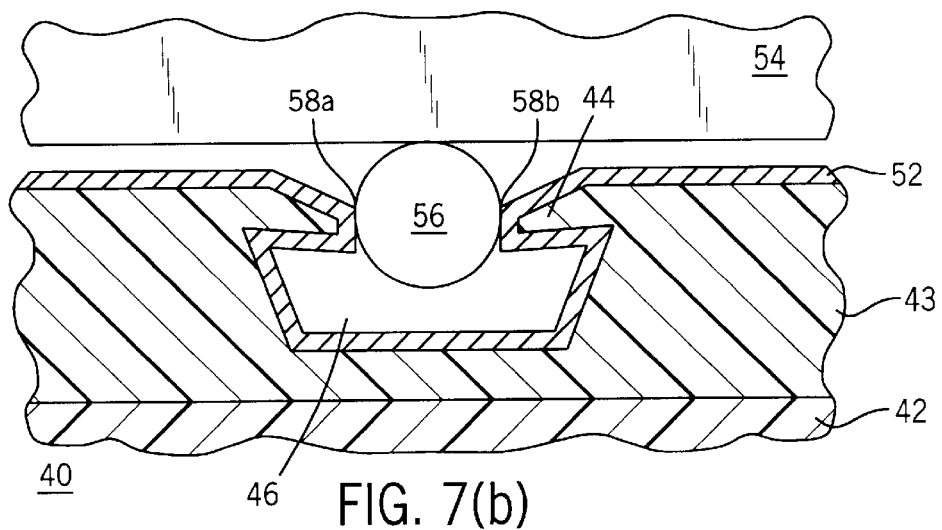

A particularly preferred microstructure 40 that may be produced through the use of the inventive process is a test apparatus 40 containing a contact test pit 46, as depicted in FIG. 7. FIG. 7(*a*) shows a top view of the pit 46 showing the location of silicon blades 44 that extend downward into the main pit cavity 46. FIG. 7(*b*) illustrates a side view of the pit 46 showing how the blades 44 and the walls of the pit cavity 46 are coated with an insulation layer 43 and a conductive layer 52 which is connected with a terminal (not shown) for testing purposes.

An integrated circuit device 54 to be tested, which may be any device having bumps or balls such as, e.g., a flip-chip, chip scale package, bumped chip or ball grid array, is lowered onto the test apparatus 40, and solder balls 56 attached to the bottom of the circuit 54 slip into the test pits 46 as shown in FIG. 7(*b*). The solder ball 56 contacts each of the silicon blades 58a, 58b. The multiple contacts 58a, 58b afforded by the test pit structure 46 permit the circuit 54 to be easily tested by providing a greater surface area of contact without requiring that the circuit 54 be pressed down onto the test apparatus 40 with excessive force.

Figure 8A:
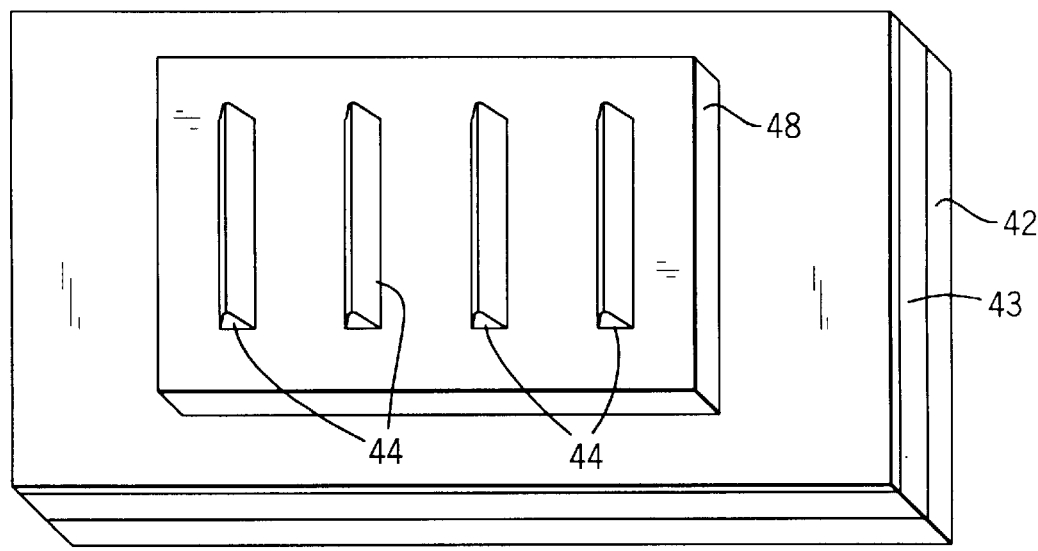
FIG. 8 depicts a contact test pillar formed by the process of the present invention.
Figure 8B:
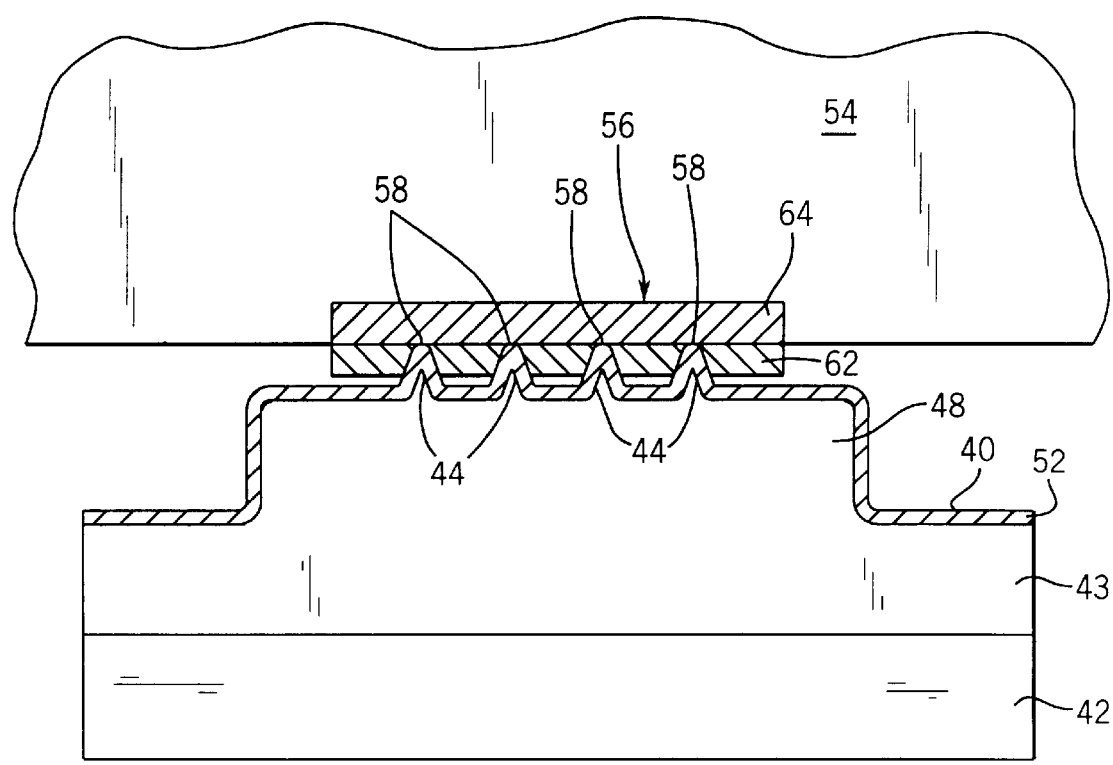

A second preferred microstructure 40 that may be produced through the use of the inventive process is a test apparatus 40 containing a contact test pillar 48, as depicted in FIG. 8. FIG. 8(*a*) shows a top view of the pillar 48 showing the location of silicon projections 44 that are adapted to penetrate the bond pads on the die so as to form an ohmic connection. FIG. 8(*b*) illustrates a side view of the pillar 48 showing how the projections 44 and the sides of the pillar 48 are coated with a conductive layer 52 that is connected with a terminal (not shown) for testing purposes.

An integrated circuit device 54 to be tested is lowered onto the test apparatus 40, and the pillars 48 make contact with the bond pads 56 on the die.

The precise micromachining afforded by the present inventive process permits the silicon pillar 48 to be precisely shaped so that a maximal contact area may be made between the pillar 48 and a bond pad 56 with a minimum of damage to the bond pad 56. In addition, micromachined projections 44 on the pillar 48 are adapted to pierce the native oxide coating 62 typically present on an aluminum or copper bond pad 56 to make contacts 58 with the underlying conductive layer 64. The multiple contacts 58 between the projections 44 and the conductive layer 62, in addition to the precise alignment of the pillars 48 and the bond pads 56, obviate the need to use excessive force to press the device 54 down onto the test apparatus 40.

As can be seen by the embodiments described herein, the present invention encompasses processes of improving pattern definition in the wet chemical etching of micromachined devices. An etchant solution containing wetting agents is subjected to ultrasonic waves during the process of etching silicon structures, which results in etchant uniformity and reduced hydrogen bubble adhesion. Silicon structures etched by the process are substantially defect-free and exhibit precise and accurate line and pattern definition, and have improved uniformity across a wafer or die.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An etching system in which to form silicon structures from silicon wafers comprising:
    an etchant mixture, wherein said mixture includes an alkaline etchant and a wetting agent;
    an etchant tank for holding the etchant mixture, wherein said etchant tank is comprised of polypropylene;
    a holder for containing silicon wafers which is freely insertable into the etchant tank; and
    at least one ultrasonic transducer capable of producing ultrasonic waves in the etchant mixture at frequencies in the range of about 20 to 40 kiloHertz.

2. The system of claim 1 further comprising an outer tank for holding the etchant tank.

3. The system of claim 1, wherein said at least one ultrasonic transducer is affixed to the holder.

4. The system of claim 1, wherein said at least one ultrasonic transducer is affixed to the inside of the etchant tank.

5. The system of claim 1, wherein said at least one ultrasonic transducer is affixed to the outside of the etchant tank.

6. The system of claim 1, wherein said at least one ultrasonic transducer is submerged in the etchant mixture, and wherein said transducer is encased in a protective sleeve.

7. The system of claim 6, wherein said protective sleeve comprises a polypropylene sleeve.

8. The system of claim 6, wherein said protective sleeve is selected from the group consisting of polytetrafluoroethylene, fluorinated ethylene propylene, ethylene-tetrafluoroethylene and perfluoroalkoxy.

9. The system of claim 1, wherein said at least one ultrasonic transducer is affixed to a stainless steel rod which is submerged in the etchant mixture, and wherein said rod is encased in a protective sleeve.

10. The system of claim 9 wherein the stainless steel rod is 316 grade stainless steel.

* * * * *